(12) United States Patent
Abawi et al.

(10) Patent No.: US 8,963,615 B1
(45) Date of Patent: Feb. 24, 2015

(54) AUTOMATIC BIPOLAR SIGNAL SWITCHING

(71) Applicant: General Electric Company, Schenectady, NY (US)

(72) Inventors: Daniel Zahi Abawi, Gardnerville, NV (US); James Merrill Roylance, Carson City, NV (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/756,099

(22) Filed: Jan. 31, 2013

(51) Int. Cl.
*H03K 17/00* (2006.01)
*H03K 17/16* (2006.01)

(52) U.S. Cl.
CPC .............. *H03K 17/16* (2013.01); *H03K 17/161* (2013.01)
USPC ........................................................ 327/415

(58) Field of Classification Search
CPC ... H03K 17/00; H03K 17/002; H03K 17/007; H03K 17/693; H03K 17/6871
USPC .......................................... 327/415, 416, 417
See application file for complete search history.

(56) References Cited

U.S. PATENT DOCUMENTS

| 5,821,790 | A | 10/1998 | Sweetman | |
| 2011/0235742 | A1* | 9/2011 | London et al. | 375/295 |
| 2012/0212214 | A1 | 8/2012 | Roylance et al. | |
| 2012/0212277 | A1 | 8/2012 | Roylance et al. | |
| 2012/0224333 | A1 | 9/2012 | Abawi | |
| 2012/0297864 | A1 | 11/2012 | Abawi | |
| 2013/0249314 | A1* | 9/2013 | Amonkar et al. | 307/113 |

FOREIGN PATENT DOCUMENTS

| EP | 0376095 A1 | 7/1990 |
| JP | S60128889 A | 7/1985 |
| JP | S62168420 A | 7/1987 |

OTHER PUBLICATIONS

International Search Report and Written Opinion mailed Apr. 23, 2014 in PCT/US2014/010640.

* cited by examiner

*Primary Examiner* — William Hernandez

(74) *Attorney, Agent, or Firm* — Fletcher Yoder, P.C.

(57) ABSTRACT

A system is provided that includes an input node configured to receive a signal indicative of sensor data. The system also includes a first transistor configured to route the signal to a positive channel when a polarity of the signal is positive. Moreover, the system includes a second transistor configured to route the signal to a negative channel when a polarity of the signal is negative. Additionally, the system includes the positive channel coupled to the first transistor configured to route the signal to an analysis component. Furthermore, the system includes the negative channel coupled to the second transistor and configured to route the signal to the analysis component.

16 Claims, 4 Drawing Sheets

AUTOMATIC BIPOLAR SIGNAL SWITCHING

BACKGROUND

The subject matter disclosed herein generally relates to signal routing to an electrical device based on a polarity of the signal.

To enable an electrical device (e.g., instrumentation device) to couple to a variety of components (e.g., transducers) that may have either a positive polarity (e.g., AC signal with +12 DC offset) or a negative polarity (e.g., AC signal with a −12 DC offset), multiple terminals in the electrical device with a dedicated terminal for expected voltages may be utilized. However, such devices include unused terminals (depending on the implementation of the device) to be included in the device, thereby increasing production costs of the device inefficiently. Other electrical devices may instead include an analog multiplexer (MUX) circuit coupled between a terminal and internal circuitry to allow a device to be coupled to a variety of components. However, these devices are often vulnerable to damage due to a susceptibility of the MUX to damage caused by electrostatic discharge (ESD) and other shock events. Alternatively, some electrical devices may require a user to manually (e.g., physically) change a configuration to a desired setting (e.g., positive polarity). However, requiring a manual setting may result in a user not changing the setting correctly and/or before each use thereby increasing the likelihood of damage to the electrical device or other unwanted results.

Other electrical devices may instead use large rail amplifiers (e.g., allow a 36V variance) to increase a tolerated voltage range in a signal on a single pin. However, large rail amplifiers typically sacrifice accuracy for flexibility and are often unable to achieve the accuracy requirements for many implementations (e.g., measurement systems). Moreover, large rail amplifiers also are more expensive than traditional amplifiers. Furthermore, large rail amplifiers are becoming more rare in implementation, thereby reducing the demand, production, and support of large rail amplifiers.

As an alternative to large rail amplifiers, some electrical devices may attenuate the signal as it enters into an input module. However, by reducing the amplitude of the signal, the electrical device also significantly reduces the signal-to-noise ratio of the attenuated signal. By reducing the signal-to-noise ratio, electrical devices that attenuate the input signal often are unable to produce accurate outputs for small input ranges.

BRIEF DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In one embodiment, a system includes an input node configured to receive a signal indicative of sensor data. The system also includes a first gating device electrically coupled to the input node. The gating device is configured to couple the input node to a positive channel when a polarity of the signal is positive and to decouple the input node from the positive channel when the polarity of the signal is negative. Furthermore, the system includes a second gating device electrically coupled to the input node. The second gating device is configured to couple the input node to a negative channel when the polarity of the signal is negative and to decouple the input node from the positive channel when the polarity of the signal is positive.

In another embodiment, a system includes an input node configured to receive a signal indicative of sensor data. The system also includes a first transistor configured to route the signal to a positive channel when a polarity of the signal is positive. Moreover, the system includes a second transistor configured to route the signal to a negative channel when a polarity of the signal is negative. Additionally, the system includes the positive channel coupled to the first transistor configured to route the signal to an analysis component. Furthermore, the system includes the negative channel coupled to the second transistor and configured to route the signal to the analysis component.

In a further embodiment, a method for channeling a signal according to polarity includes receiving a signal having both a DC and AC component. Moreover, the method also includes determining a polarity of the DC component. Furthermore, the method includes toggling a positive switch closed and toggling a negative switch open to route the signal through a positive channel if the polarity is positive. The method also includes toggling the negative switch closed and toggling the positive switch open to route the signal through a negative channel if the polarity is negative.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

As discussed in detail below, a system that automatically routes a signal depending on the polarity of a signal without requiring user selection and/or configuration reduces a likelihood of connection of voltages that an electrical device is not correctly configured manually by the user. Moreover, a system that channels the signal using a polarity of the signal, the signal can be analyzed without attenuating the signal thereby reducing a signal to noise ratio of the signal causing less accurate signals without including an analog multiplexer that is susceptible to ESD or other shock events. Furthermore, a system that channels the signal using a polarity of the signal, the signal can be conditioned (e.g., amplified) without using large rail operational amplifiers that are more expensive than traditional op amps and have decreased accuracy unsuitable for many intended uses of an electrical device. In other words, by channeling the signal according to polarity, a system with a robust design may be included that is less susceptible to ESD, improper connections, or loss of accuracy that may be present in alternative electrical devices.

Figure 1:
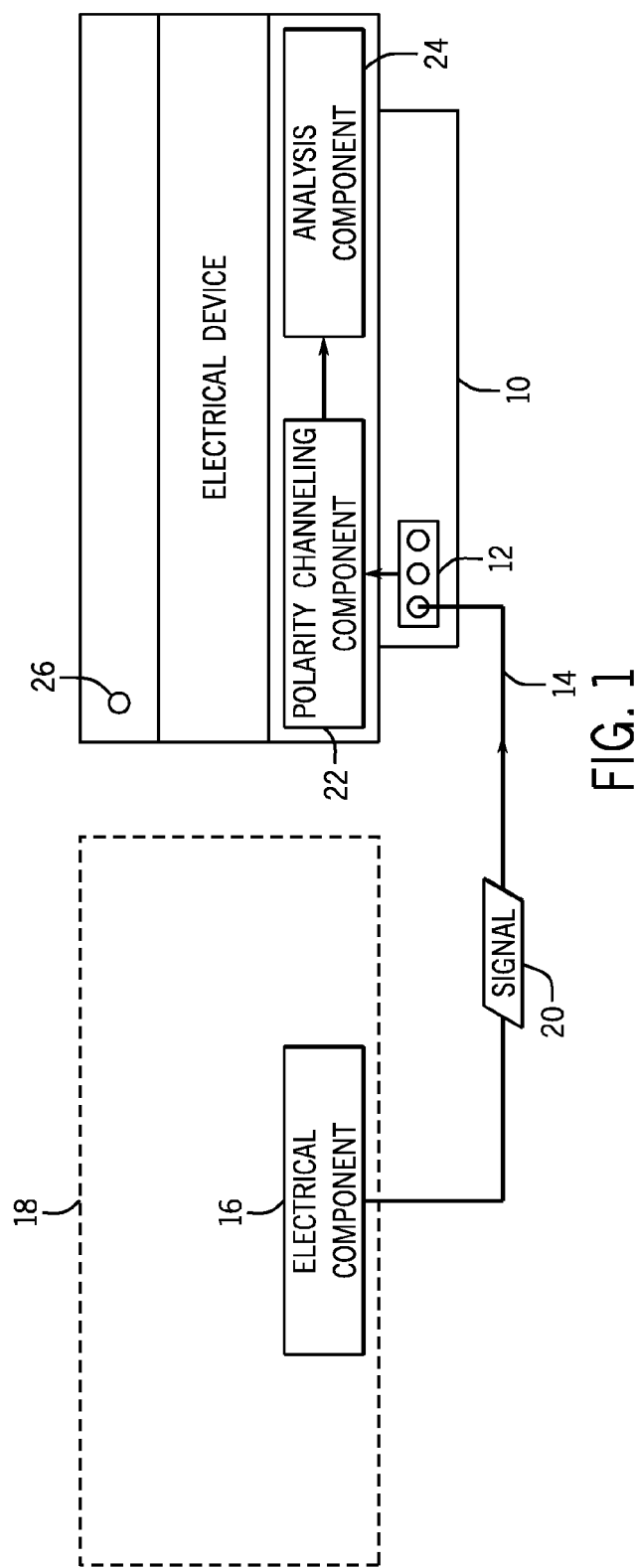
FIG. 1 is a block diagram view of an embodiment including an electrical device.

FIG. 1 is a block diagram view of an embodiment of an electrical device 10. In some embodiments, the electrical device 10 may include an instrumentation system, such as a monitoring system similar to a 3500 Series Machinery Protection System with Bently Nevada™ Asset Condition Monitoring made available by General Electric® of Schenectady, N.Y. The illustrated electrical device 10 includes one or more terminals 12 that are configured to electrically couple to a data connector 14 (e.g., data cable, wire, etc.). Although the illustrated electrical device 10 includes three terminals 12, some embodiments of the electrical device 10 may include one, two, three, or more terminals. Additionally, some embodiments of the electrical device 10 may have a variable number of terminals through the use of a "rack-based design" to increase flexibility of use of the electrical device 10. In certain embodiments, each of the terminals 12 may couple to a data connector 14. In some embodiments, the terminals 12 may be decoupled from a respective data connector 14 when the terminal is not used. For example, in some embodiments, the data connector 14 and/or the terminal 12 may include one or more suitable electrical connectors, such as Bayonet Neill-Concelman (BNC) connectors, plug and socket connectors, posts, and/or terminal blocks. In certain embodiments, the data connector 14 also couples to electrical component 16. In some embodiments, the data connector 14 may be fixed to the electrical component 16. In other embodiments, the data connector 14 may be removably coupled to the electrical component 16 using a suitable removable electrical connector.

In certain embodiments, the electrical component 16 may include various electrical devices, such as transducers or other suitable measurement devices that are used to measure various parameters of a monitored system 18. For example, the electrical component 16 may include a velocity sensor, acceleration sensor, proximity sensor, eddy current sensor, rotation sensor, pressure sensor, or other suitable measuring devices. Additionally, the electrical component 16 may include various types of interfaces, such as a one-wire interface, a two-wire interface, a three-wire interface, or another suitable interface. In some embodiments, the monitored system 18 may include one or more of the following: steam turbines, hydraulic turbines, industrial gas turbines, aero-derivative turbines, compressors, gears, turbo-expanders, centrifugal pumps, motors, generators, fans, blowers, agitators, mixers, centrifuges, pulp refiners, ball mills, crushers/pulverizers, extruders, pelletizers, cooling towers/heat exchanger fans, and other systems suitable to be electrically monitored. In various embodiments, a signal 20 (e.g., electrical signal representing air pressure in the monitored system 18) is sent via the data connector 14 from the electrical component 16 to the electrical device 10.

Upon receiving the signal 20 from the electrical component 16 via the data connector 14, the electrical device 10 routes the signal 20 to a polarity channeling component 22. Various electrical components 16 may include AC and DC components with a polarity of the DC component varying according to the type/manufacturer of electrical component 16. As discussed below, the polarity channeling component 22 routes the signal 20 to an appropriate analysis component 24 according to polarity of the signal 20. The analysis component 24 may convert the signal 20 to a desired format. For example, in some embodiments, the analysis component 24 may condition the signal 20 for use by the electrical device 10. Additionally, some embodiments of the analysis component 24 may track values indicated by the signal 20 and determine whether the value falls within a tolerance range. In some embodiments, the analysis component 24 may cause an alarm to be triggered when the measured value exceeds a tolerance range or a monitoring connection has faulted (e.g. broken wire).

Furthermore, the electrical device 10 may include one or more status indicators 26. In some embodiments, the status indicators 26 may indicate that the electrical device 10 is powered on. The indicators 26 may additionally and/or alternatively display information representing a status of the monitored system 18 (e.g., standby, alarms, etc.). In certain embodiments, one or more of the indicators 26 may represent whether there is a fault (e.g., monitored system 18 is not being properly monitored due to a broken wire, etc.) in the monitored system 18, the electrical component 16, the data connector 14, and/or the electrical device 10.

Figure 2:
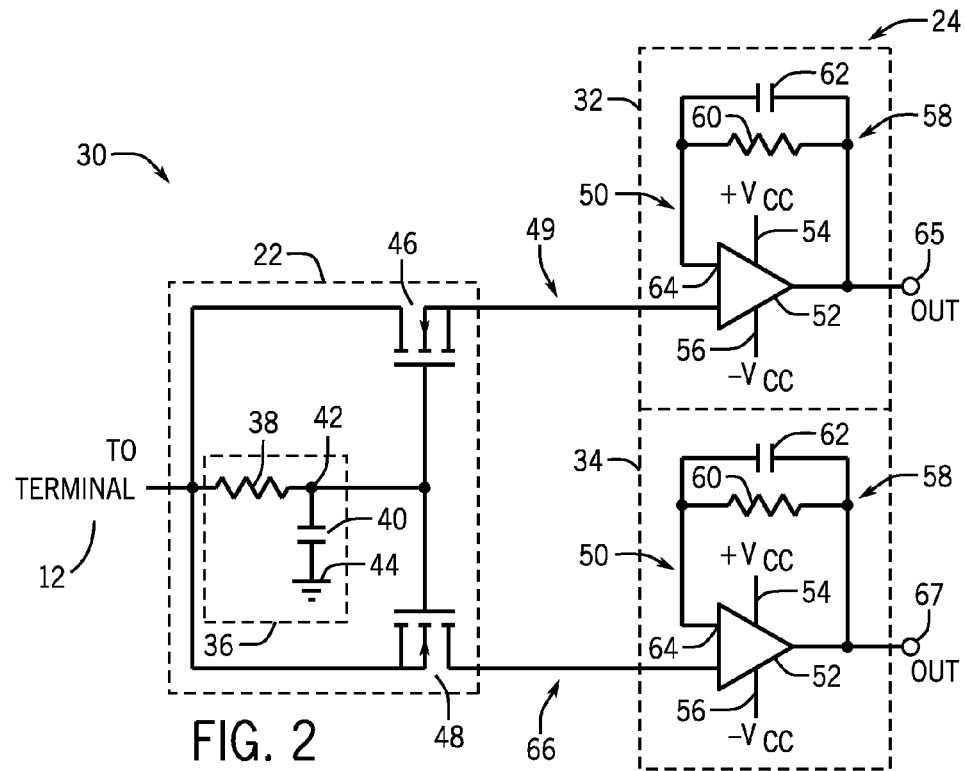
FIG. 2 is a schematic diagram view of an embodiment of circuitry that may be used in the electrical device of FIG. 1.

FIG. 2 is a schematic diagram view of an embodiment of circuitry 30 that may be used in the electrical device 10. As illustrated, the circuitry 30 includes the polarity channeling component 22 and at least a portion of the analysis component 24. In the illustrated embodiment, the analysis component 24 includes a negative polarity conditioning circuit 32 and a positive polarity conditioning circuit 34. As discussed below, the signal 20 is routed to the positive polarity conditioning circuit 34 when the signal 20 has a positive polarity and to the negative polarity conditioning circuit 32 when the signal 20 has a negative polarity. As discussed below, in some embodiments, the polarity channeling component 22 may channel into a single conditioning circuit (e.g., positive polarity conditioning circuit 34). In such embodiments, the signal 20 may be routed through an inverter prior entrance into a conditioning circuit.

To route the signal 20 based on the polarity of the signal 20, the polarity channeling circuit 22 first receives the signal 20 from the terminal 12. In some embodiments, additionally circuitry may be included to modify the signal 20 (e.g. filter and/or amplify) prior to receipt by the polarity channeling circuit 22. Additionally or alternatively, in certain embodiments, the polarity channeling circuit 22 may include signal refining components. For example, after the signal 20 is received by the polarity channeling circuit 22, some embodiments of the polarity channeling circuit 20 may include an RC filter 36 that extracts a DC component of the signal 20 using a filter resistor 38 (through which the signal 20 passes) and a filter capacitor 40 coupled between a filter node 42 and ground 44. In some embodiments, values for the resistor 38 and the capacitor 40 may be selected to extract the DC component of the signal 20 at filter node 42.

In certain embodiments, the voltage at the filter node 42 is coupled to a negative switch 46 and a positive switch 48. As illustrated, in some embodiments the negative switch 46 and the positive switch 48 are n-channel metal-oxide semiconductor field-effect transistors (NMOS) biased in opposite directions. However, other embodiments may include various other transistors such as junction field-effect transistor (JFET) devices, other metal-oxide semiconductor field-effect transistor (MOSFET) devices (e.g., PMOS) bipolar junction transistors (BJTs), or other suitable switching devices.

As can be appreciated, when the voltage at the filter node 42 reaches a sufficiently negative value, the voltage (e.g., $V_{GS}$, $V_{AS}$) across the negative switch 46 exceeds the voltage threshold ($V_{TH}$) of the negative switch 46, thereby causing the negative switch 46 to toggle into a closed state, thus enabling a current flow across the negative switch 46 through a negative channel 49. Accordingly, when the voltage of the signal 20 is negative, the negative switch 46 routes the signal 20 to the negative polarity conditioning circuit 32 via the negative channel 49. Furthermore, when the voltage at the filter node 42 is negative, the voltage across the positive switch 48 does not exceed the $V_{TH}$ required to close the switch. Accordingly, the positive switch 48 is open when the voltage at the filter node 42 is negative.

As noted above, when the negative switch 46 is closed, current flows along the negative channel 49 to the negative polarity conditioning circuit 32. In some embodiments, the negative polarity conditioning circuit 32 includes filtering circuitry, voltage offsetting, and/or other signal conditioning readily known in the field of signal conditioning. As illustrated, some embodiments of the negative polarity condition circuit 32 include voltage amplification circuitry 50. For example, the voltage amplification circuitry 50 may include an operational amplifier 52 (op-amp) amplifier in a suitable configuration, such as inverting amplifier circuits, non-inverting circuits, and/or other suitable amplification circuits. Moreover, the op-amp 52 may be powered using a $+V_{cc}$ 54 and a $-V_{cc}$ 56 that may each be selected according the expected parameters of the signal 20. For example, in some embodiments, the $+V_{cc}$ 54 of the negative polarity conditioning circuit 32 may be +5V and the $-V_{cc}$ 56 may be -24V, and the $+V_{cc}$ 54 of the positive polarity conditioning circuit 34 may be +24V and the $-V_{cc}$ 56 may be -5V. However, other suitable voltages may be used according to expected parameters of the signal 20.

As illustrated, in embodiments of the voltage amplification circuitry 50 using the op-amp 52, a feedback loop 58 is included. In certain embodiments, the feedback loop 58 includes a feedback resistor 60 that may be selected according to a desired amplification factor. For example, in certain embodiments, the feedback resistor 60 may be 20 kΩ or another suitable resistance value. Some embodiments of the feedback loop 58 include a feedback capacitor 62 in addition to the feedback resistor 60. The inclusion of the feedback capacitor 62 may be included to compensate for parasitic capacitance at an input 64 of the op-amp 52. The feedback capacitor 62 may also be included to reduce gain at higher frequencies. In various embodiments, the feedback capacitor 62 may include a relatively small capacitance capacitor, such as a 100 pF or another suitable capacitance capacitor. After the signal 20 having a negative polarity is conditioned by the negative polarity conditioning circuit 32, the signal 20 is then output through the negative out 65. In some embodiments, the signal at the negative out 65 may be further analyzed by the analysis component 24 and/or the electrical device 10.

As can be appreciated, when the voltage at the filter node 42 is sufficiently positive instead of negative, the voltage (e.g., $V_{GS}$, $V_{DS}$) across the positive switch 48 exceeds the voltage threshold ($V_{TH}$) of the positive switch 48, thereby causing the positive switch 48 to toggle into enabling a current flow across the positive switch 48 through a positive channel 66. Accordingly, when the voltage of the signal 20 is positive, the positive switch 48 routes the signal 20 to the positive polarity conditioning circuit 34 via the positive channel 66. Furthermore, when the voltage at the filter node 42 is positive, the voltage across the negative switch 46 does not exceed the $V_{TH}$ required to close the switch. Accordingly, the positive switch 48 is open when the voltage at the filter node 42 is positive.

In some embodiments, the positive polarity conditioning circuit 34 includes filtering circuitry, voltage offsetting, and/or other signal conditioning readily known in the field of signal conditioning. Similar to the negative polarity conditioning circuit 32, some embodiments of the positive polarity condition circuit 34 include voltage amplification circuitry 50. As discussed above, certain embodiments of the voltage amplification circuitry 50 may include an operational amplifier 52 (op-amp) amplifier circuits, such as inverting amplifier circuits, non-inverting circuits, and/or other suitable amplification circuits.

After the signal 20 having a positive polarity is conditioned by the positive polarity conditioning circuit 34, the signal 20 is then output through the positive out 67. In some embodiments, the signal at the positive out 67 may be further analyzed by the analysis component 24 and/or the electrical device 10. The measured values of the signal 20 at the outs 65, 67 may be used to affect a status of the indicators 26 and/or other functions of the electrical device 10 and/or electrical component 16.

Furthermore, in some embodiments, one channel (e.g. positive channel 66) may be inverted and routed through an opposite polarity conditioning circuit (e.g., negative polarity conditioning circuit 34). Moreover, certain embodiments may have a single out that may be connected to the negative out 65 and the positive out 67. For example, some embodiments may include the voltage amplification circuitry 50 arranged in a non-inverting amplifier configuration in the negative polarity conditioning circuit 34 and/or positive polarity conditioning circuit 36 and the voltage amplification circuitry 50 arranged in an inverting amplifier configuration in the negative polarity conditioning circuit 34 and/or positive polarity conditioning circuit 36.

Figure 3:
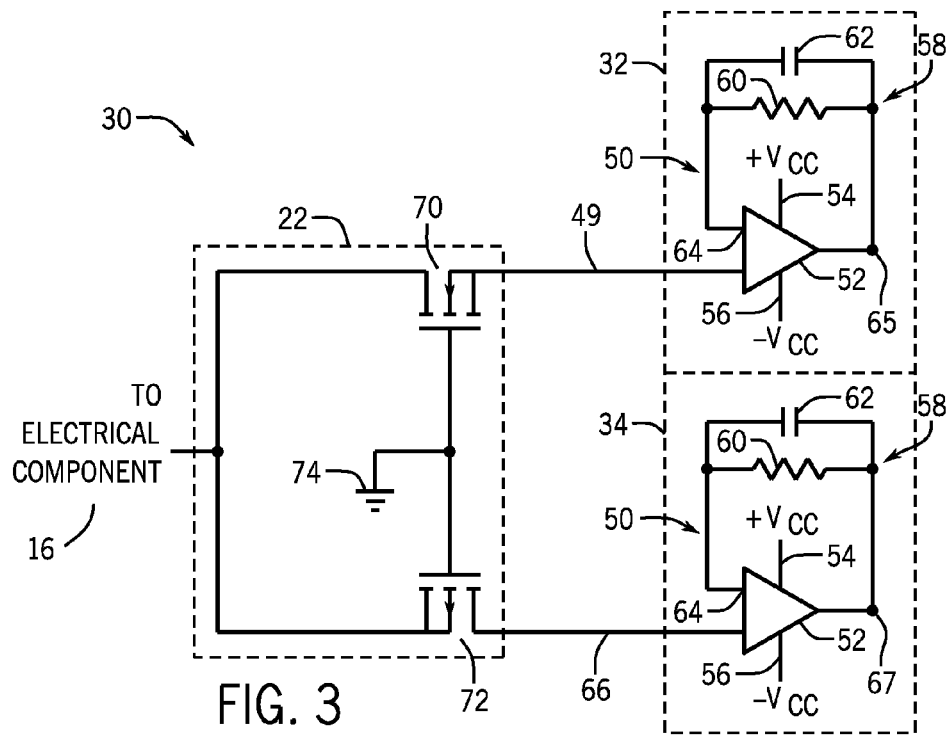
FIG. 3 is a schematic diagram view of an alternative embodiment of the circuitry of FIG. 2 that may be used in the electrical device of FIG. 1.

FIG. 3 is a schematic diagram view of an alternative embodiment of the circuitry 30 that may be included in the electrical device 10. In the illustrated embodiment of the polarity channeling circuit 22, the polarity channeling circuit 22 includes a negative switch 70 and a positive switch 72. The gate of each switch is connected to ground 74. As the signal 20 enters the polarity channeling circuit 22, the polarity of the signal 20 switches the appropriate switch 70 or 72 by modifying the voltage difference between the gate and the source/drain of the switch 70 and 72 due to change of the voltage of the source/drain. When the voltage (e.g., $V_{GS}$, $V_{DS}$) crosses the threshold voltage ($V_{TH}$) used to toggle the switch into a transmitting mode (e.g., saturation). For example, when the voltage of the signal 20 is negative, the negative switch 70 routes the signal to the negative polarity conditioning circuit 32 via the negative channel 49 while the positive switch 72 remains toggled open. When the voltage of the signal 20 is positive, the negative switch 70 toggles open and the positive switch 72 toggles closed, thereby routing the signal 20 to the positive polarity conditioning circuit 34 via the positive channel 66. In other words, the polarity channeling circuit 22 routes the signal 20 according to the polarity of the signal.

Moreover, once the signal 20 is routed to the negative polarity conditioning circuit 32 or the positive polarity conditioning circuit 34, the signal 20 may be processed and/or conditioned in a suitable manner. For example, the signal 20 may be amplified using the amplification circuits 50 described above in relation to FIG. 2. Furthermore, the electrical device 10, the polarity channeling circuit 22, the negative polarity conditioning circuit 32, and/or the positive polarity conditioning circuit 34 may include additional circuitry used to add/remove additional desired characteristics to/from the signal. For example, the electrical device 10, the polarity channeling circuit 22, the negative polarity conditioning circuit 32, and/or the positive polarity conditioning circuit 34 may include additional resistors, capacitors, diodes, filters, neutral ground resistors (NGR), or other suitable electrical signal processing devices to attain desired signal characteristics for the signal 20

Figure 4:
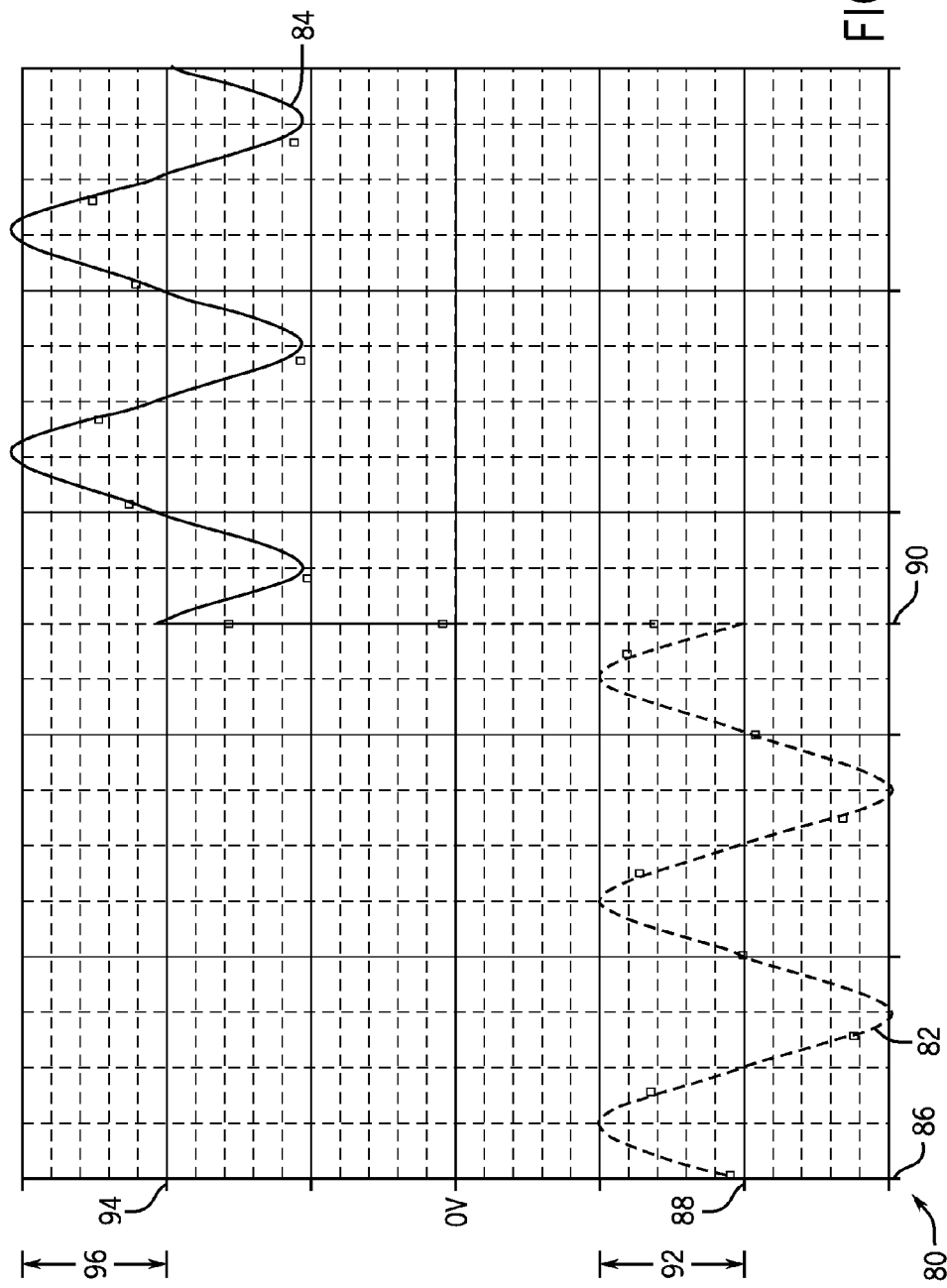
FIG. 4 is a graphical view of an embodiment of a signal after conditioning that may be received from the circuitry of FIG. 2 or FIG. 3.

FIG. 4 is a graphical view of an embodiment of the signal 20 after conditioning via the negative polarity conditioning circuit 32 and/or the positive polarity conditioning circuit 34. In other words, the graph 80 shows a negative output 82 that may be produced at the negative out 65 shown as a dashed line and a positive output 84 that may be produced at the positive out 67 shown as a solid line. As previously discussed, as the signal 20 with a negative polarity enters the polarity channeling circuit 22 at initial time 86, the negative switch 46, 70 routes the signal 20 through the negative polarity conditioning circuit 32. After processing the signal 20 using the negative polarity conditioning circuit 32, the negative output 82 has an initial negative DC offset 88, such as less than or equal to −0V (e.g., less than or equal to −5V, −10V, −15V, or some other suitable negative voltage). Additionally, the negative output 82 includes an AC signal with an amplitude 92 (e.g., 5V). Furthermore, because the signal 20 is routed to the negative polarity conditioning circuit 32, the positive output 84 is negligible at the initial time 86. At a switch time 90, the polarity of the signal 20 is no longer negative. For example, the polarity of the signal 20 may change due to a disconnection of the electrical component 16 (e.g., transducer) that sends a negative signal, and the connection of another component (e.g., a different transducer) that sends a positive signal. Alternatively, in some embodiments, the electrical device 16 may alternate between a positive and negative polarity in the signal 20 that it sends depending on certain conditions (e.g., measured values exceeding a threshold).

After switch time 20, when the signal 20 is positive, the negative switch 46, 70 blocks the signal 20 from reaching the negative polarity conditioning circuit 32. As illustrated by the graph 80, the signal 20 is switched directly from a negative polarity to a positive polarity. However, as can be appreciated, a switching period may last some period of time causing a negligible voltage to be produced at both the positive output 84 and the negative output 82.

Returning to FIG. 4, as the signal 20 gains a positive polarity at the switch time 90, the positive switch 48, 72 closes and routes the signal 20 to the positive polarity conditioning circuit 34. Accordingly, the negative output 82 becomes negligible at the switch time 90. The positive output 84 then contains a positive DC offset 94, such as greater than or equal to 0V (e.g., greater than or equal to 5V, 10V, 15V, or some other suitable positive voltage). The positive output 84 further includes an AC component having an amplitude 96.

Although the illustrated negative DC offset 88 and the positive DC offset 94 are approximately equal, other embodiments of the electrical device 10 may be designed to output a different DC offset for a positive and negative signals. For example, amplifier circuit 50 in the negative polarity conditioning circuit 32 may differ from the amplifier circuit 50 in the positive polarity conditioning circuit 34 to achieve an a positive output 84 and negative output 82 having differing characteristics, such as different DC offsets, AC frequencies, AC amplitudes, or other signal parameters.

Figure 5:
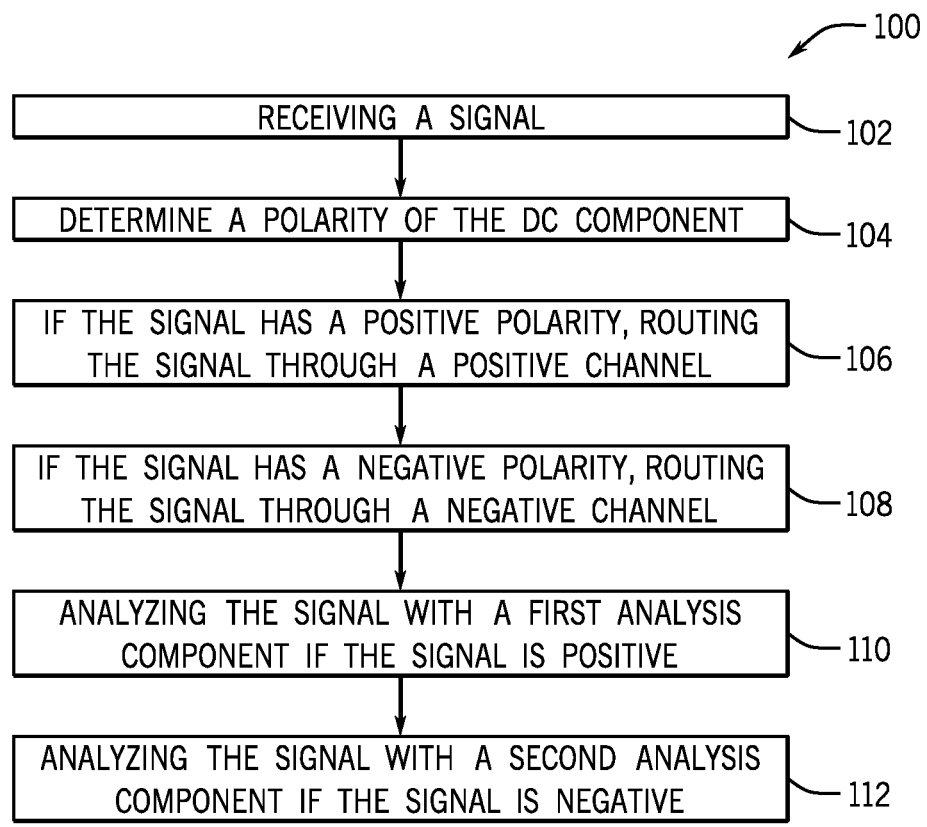
FIG. 5 is a flow chart view illustrating an embodiment of a method for channeling a signal of FIG. 1 according to its polarity.

FIG. 5 is a flow chart view illustrating an embodiment of a method 100 for channeling a signal according to polarity. The method 100 includes receiving a signal having a negative polarity or a positive polarity (block 102). In some embodiments, the signal includes an AC component and a DC component. The method 100 further includes determining a polarity of the DC component of the signal (block 104). For example, the polarity may be determined using a gate for each polarity. In other words, a positive switch closes when the signal is positive, and a negative switch closes when the signal is negative.

The method 100 also includes switching a positive switch if the signal has a positive polarity that routes the signal through a positive channel (block 106). In some embodiments, the positive channel is coupled to a first analysis component. As discussed above, in certain embodiments, the positive switch is switched due to a difference in voltage between the gate and a drain/source depending on whether the switch is a p-mode transistor an n-mode transistor. If the signal has a negative polarity, the method 100 includes switching a negative switch to route the signal through a positive channel (block 108). In certain embodiments, the positive channel is coupled to a second analysis component. Certain embodiments of the method 100 may also include analyzing the signal with the first analysis component if the signal has a positive polarity (block 110). Similarly, certain embodiments of the method 100 may also include analyzing the signal with the second analysis component if the signal has a negative polarity (block 112).

Technical effects of the invention include routing a signal depending on the polarity of a signal without requiring user selection and/or configuration. Accordingly, the polarity channeling decreases a likelihood of connection of voltages that an electrical device is not correctly configured manually by the user. Instead, upon connection of an electrical component, the signal is routed by a polarity channeling component according to the polarity of the signal rather than relying upon manual selection. Accordingly, the likelihood of an accidental connection of an incorrect polarity is reduced, thereby reducing likelihood of damage to the system.

Moreover, by channeling the signal using a polarity of the signal, the signal can be analyzed without attenuating the signal thereby reducing a signal to noise ratio of the signal causing less accurate signals. Additionally, by channeling the signal using a polarity of the signal, the signal can be analyzed without including an analog multiplexer that is susceptible to ESD or other shock events. Furthermore, by channeling the signal using a polarity of the signal, the signal can be conditioned (e.g., amplified) without using large rail operational amplifiers that are more expensive than traditional op amps and have decreased accuracy unsuitable for many intended uses of an electrical device. In other words, by channeling the signal according to polarity, a robust design may be included that is less susceptible to ESD, improper connections, or loss of accuracy that may be present in alternative electrical devices.

This written description uses examples to disclose the above description, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system comprising:
   an input node configured to receive a signal indicative of sensor data;
   a first gating device electrically coupled to the input node, wherein the first gating device is configured to couple the input node to a positive channel when a polarity of the signal is positive and to decouple the input node from the positive channel when the polarity of the signal is negative;
   a second gating device electrically coupled to the input node, wherein the second gating device is configured to couple the input node to a negative channel when the polarity of the signal is negative and to decouple the input node from the negative channel when the polarity of the signal is positive; and
   a positive conditioning circuit electrically coupled to the positive channel, wherein the positive conditioning circuit is configured to condition the signal when the signal is positive; and
   a negative conditioning circuit electrically coupled to the negative channel, wherein the negative conditioning circuit is configured to condition the signal when the signal is negative.

2. The system of claim 1, wherein the input node is configured to receive the signal from a transducer.

3. The system of claim 1, wherein the first gating device comprises a transistor and the second gating device comprises a transistor.

4. The system of claim 3, wherein the transistor of the first gating device comprises a metal-oxide semiconductor field-effect transistor (MOSFET), a bi-polar junction transistor (BJT), or a junction field-effect transistor (JFET) and the second gating device comprises a MOSFET, a BJT, or a JFET.

5. The system of claim 4, wherein a gate of each of the transistors of the gating devices is electrically coupled to ground.

6. The system of claim 1, wherein the signal comprises an AC component and a DC component.

7. The system of claim 6, wherein the polarity of the signal is positive when the DC component has a voltage greater than 0V.

8. The system of claim 6, wherein the polarity of a signal is negative when the DC component has a voltage less than 0V.

9. A system comprising:
   an input node configured to receive a signal indicative of sensor data;
   a first transistor configured to route the signal to a positive channel when a polarity of the signal is positive;
   a second transistor configured to route the signal to a negative channel when a polarity of the signal is negative;
   the positive channel coupled to the first transistor and configured to route the signal to an analysis component; and
   the negative channel coupled to the second transistor and configured to route the signal to the analysis component;
   wherein the analysis component comprises:
   a positive conditioning circuit electrically coupled to the first transistor, wherein the positive conditioning circuit is configured to modify the signal when the signal is positive; and
   a negative conditioning circuit electrically coupled to the second transistor, wherein the negative conditioning circuit is configured to modify the signal when the signal is negative.

10. The system of claim 9, wherein a first gate of the first transistor is electrically coupled to ground and a second gate of the second transistor is electrically coupled to ground.

11. The system of claim 9, wherein the signal comprises an AC component and a DC component.

12. The system of claim 11, comprising a filter configured to extract the DC component from the signal.

13. The system of claim 12, wherein a first gate of the first transistor and a second gate of the second transistor are configured to receive the extracted DC component of the signal.

14. The system of claim 11, wherein the first transistor comprises a metal-oxide semiconductor field-effect transistor (MOSFET), a bi-polar junction transistor (BJT), a junction field-effect transistor (JFET), or some combination thereof and the second transistor comprises a MOSFET, a BJT, a JFET, or some combination thereof.

15. A method for channeling a signal according to polarity:
   receiving a signal having both a DC and an AC component;
   determining a polarity of the DC component;
   if the polarity is positive:
      toggling a positive switch closed and toggling a negative switch open to route the signal through a positive channel; and
      routing the signal to a positive signal conditioning circuit
   if the polarity is negative:
      toggling the negative switch closed and toggling the positive switch open to route the signal through a negative channel.
      routing the signal to a negative signal conditioning circuit.

16. The method of claim 15, comprising, wherein the positive signal conditioning circuit comprises a first operational amplifier and the negative signal conditioning circuit comprises a second operational amplifier.

* * * * *

UNITED STATES PATENT AND TRADEMARK OFFICE
CERTIFICATE OF CORRECTION

PATENT NO. : 8,963,615 B1
APPLICATION NO. : 13/756099
DATED : February 24, 2015
INVENTOR(S) : Abawi et al.

It is certified that error appears in the above-identified patent and that said Letters Patent is hereby corrected as shown below:

In the specification

In Column 5, Line 2, delete "circuit 20" and insert -- circuit 22 --, therefor.

In Column 5, Line 21, delete "$V_{AS}$)" and insert -- $V_{DS}$) --, therefor.

In Column 7, Line 54, delete "switch time 20," and insert -- switch time 90, --, therefor.

In Column 8, Line 36, delete "positive" and insert -- negative --, therefor.

In the claims

In Column 10, Line 1, in Claim 8, delete "of a signal" and insert -- of the signal --, therefor.

In Column 10, Line 32, in Claim 14, delete "11," and insert -- 9, --, therefor.

In Column 10, Line 50, in Claim 15, delete "channel." and insert -- channel; and --, therefor.

Signed and Sealed this
Twenty-fourth Day of November, 2015

Michelle K. Lee
*Director of the United States Patent and Trademark Office*